(12) United States Patent
Ungstad

(10) Patent No.: US 6,930,523 B2
(45) Date of Patent: Aug. 16, 2005

(54) APPARATUS AND METHOD FOR REFLECTION DELAY SPLITTING DIGITAL CLOCK DISTRIBUTION

(75) Inventor: Steve James Ungstad, Colorad Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/697,131

(22) Filed: Oct. 30, 2003

(65) Prior Publication Data

US 2005/0093592 A1 May 5, 2005

(51) Int. Cl.[7] .................................................. H03L 7/06
(52) U.S. Cl. ........................................ 327/156; 331/11
(58) Field of Search .................... 327/156, 147, 327/146, 154, 155, 163; 375/373, 374, 375, 375/376; 331/11, 25

(56) References Cited

U.S. PATENT DOCUMENTS

| | | | | |
|---|---|---|---|---|
| 6,072,846 A | * | 6/2000 | Kyung et al. | 375/354 |
| 6,246,864 B1 | * | 6/2001 | Koike | 455/110 |
| 6,553,089 B2 | * | 4/2003 | Huh et al. | 375/376 |
| 6,577,695 B1 | * | 6/2003 | Everitt et al. | 375/375 |
| 6,683,930 B1 | * | 1/2004 | Dalmia | 375/376 |
| 6,704,383 B2 | * | 3/2004 | Lee et al. | 375/376 |

* cited by examiner

Primary Examiner—Linh My Nguyen

(57) ABSTRACT

A clock distribution system including a first and second phase detector. The first phase detector outputs a phase lead of an output clock signal. The second phase detector outputs a phase lag of a returned clock signal. Circuitry is included that propagates the output clock signal onto a transmission line based on the average the output of the first phase detector and the second phase detector.

12 Claims, 3 Drawing Sheets

APPARATUS AND METHOD FOR REFLECTION DELAY SPLITTING DIGITAL CLOCK DISTRIBUTION

BACKGROUND OF THE INVENTION

Today's high performance systems need clock generation systems that minimize skew. Indeed, skew has become the major part of constraints that form the upper boundary for the system clock frequency. Skew is defined as the difference in time between simultaneous clock signals within a system.

Reduction in system clock skew reduces cost by avoiding complicated architecture or the necessity for faster logic components. Further, as skew is reduced, higher clock rates and better timing analysis become possible. It desirable to provide every component that needs clocking, such as flip-flops and latches, with the edge of the clock at the same time within each clock period. As can be expected, in current system design, extensive (and expensive) resources are dedicated to creating clock distribution systems and methodologies that minimize skew across entire system.

Known clock distribution methodologies focus on the creation of geometrically similar clock distribution circuits known as clock trees. In other words, each component that receives a clock signal is connected to the reference clock by a trace of the same length having the same electrical characteristics. It is know to provide buffers, at the nodes of such trees to distribute the clock signals. Distributed clock networks are also know that provide for the replication of the clock signal with a single phase locked loop located at multiple points ("nodes") across a tree (typically in conjunction with a buffer), and distributing the replicated clock signal only to a small section of the chip—once again using equivalent length traces.

The use of clock trees and distributed clock networks requires a significant amount of space on the chip or board and an equally significant amount of design time to ensure that all components requiring a synchronized clock input are located on the clock tree. Several software programs are available that assist with the optimizing of the layout of clock trees. Of course such optimization often comes at the expense of alternative layout that would provide greater design freedom or benefits from a non-distance based layout of components.

The use of clock trees also requires that any transmission line be of a fixed known length. Solutions that depend on fixed length signal paths have proven unsuitable in situations where it is desirable that the signal path be variable either during the design stage or in the actual product. For example, the transmission of a synchronized clock signal over data busses, such as SCSI, AGP, or PCI is difficult. The length of the bus is often varied during the design stage and installers and users frequently expand the bus with riser blocks and bus expanders—both of which increase the length of transmission lines—inducing skew.

Accordingly, the present inventors have recognized a need for clock distribution apparatus and methods capable of providing a coincident clock to dispersed locations wherein the clock traces can be of a variable length.

BRIEF DESCRIPTION OF THE DRAWINGS

An understanding of the present invention can be gained from the following detailed description of the invention, taken in conjunction with the accompanying drawings of which.

DETAILED DESCRIPTION

Figure 1:
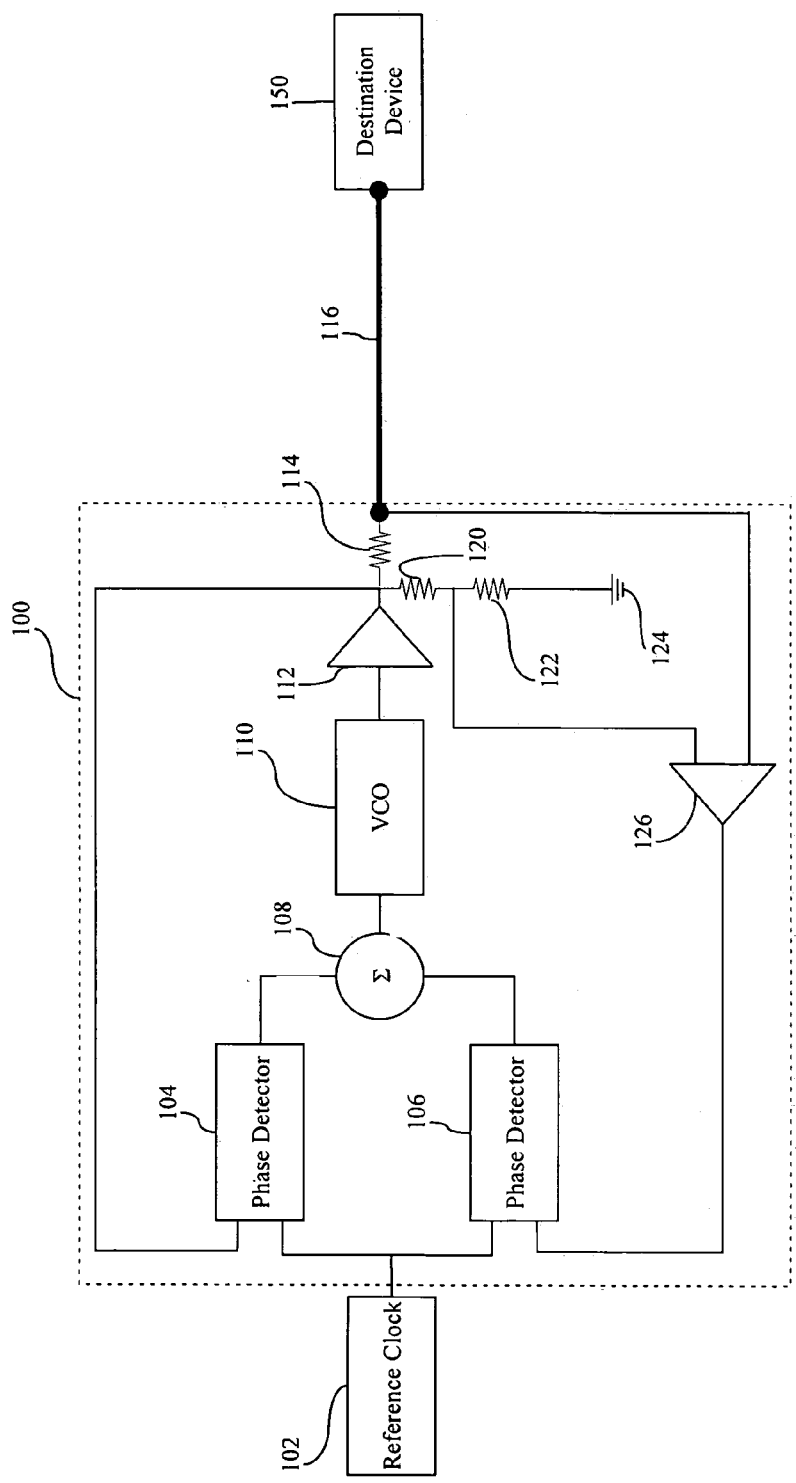
FIG. 1 is a block diagram of a clock distribution circuit in accordance with a first preferred embodiment of the present invention.

Reference will now be made in detail to the present invention, examples of which are illustrated in the accompanying drawings, wherein like reference numerals refer to like elements throughout.

FIG. 1 is a block diagram of a clock distribution circuit 100 in accordance with a first preferred embodiment of the present invention. It will be appreciated by those of ordinary skill in the relevant arts that the clock distribution circuit 100, as illustrated in FIG. 1, and the operation thereof as described hereinafter is intended to be generally representative such systems and that any particular system may differ significantly from that shown in FIG. 1, particularly in the details of construction and operation of such system, and still fall within the scope of the invention and the appended claims. As such, the clock distribution circuit 100 is to be regarded as illustrative and exemplary and not limiting as regards the invention described herein or the claims attached hereto. It is also to be noted that the block diagram shown in FIG. 1 has been simplified to avoid obscuring the present invention. Further, there are functional components that have been left out or conveniently combined with other functional components in FIG. 1.

FIG. 1 illustrates an embodiment of the present invention as applied to a source terminated destination device, also referred to as series termination or a point-to-point architecture. In FIG. 1 a reference clock 102 is supplied to a first input of a first phase detector 104 and a first input of a second phase detector 106. The first and second phase detectors 104 and 106 are preferable type II phase detectors, but may comprise type I if cost is an issue and delays are limited to ±II/2. For delays greater than ±II/2 additional circuitry may be required. In general, the first phase detector 104 detects a phase lead of the output clock signal, while the second phase detector 106 detects a phase lag of a returned clock signal. In accordance with the first embodiment of the present invention, the returned clock signal comprises a reflected clock signal. The clock distribution circuit 100 outputs a signal based on the average of the phase lead and the phase lag.

The example shown in FIG. 1 illustrates a single clock signal sent to a single destination device. Those of ordinary skill in the art will recognize that most implementations of a clock transmission system in accordance with the embodiments of the present invention will involve multiple transmission lines. Each transmission line would have an instance of a clock distribution circuit 100 fed by the same reference clock. Each instance would preferably be connected to the reference clock 102 with a trace of the same length and electrical characteristics. It is possible for the output of any single clock distribution circuit 100 to feed multiple instances of other clock distribution circuits in much the same configuration as a distributed clock networks.

A summing circuit 108 averages the outputs of the phase detector 104 and the phase detector 106. The summing circuit could, for example, comprise two equal value resistors that would typically be part of a common low-pass filter from the phase detectors 104 and 106. Alternatively, digital logic circuits can be used and may in fact be preferable as logic could be added to compensate for situations where the lag exceeds 180 degrees. The output of the summing circuit 108 is used to drive a voltage-controlled oscillator (VCO) 110. The resultant signal, termed herein the output clock signal, is supplied to a transmission line 116 via a buffer 112 and a build out resistor 114. The buffer 112 acts to isolate the VCO 110 from the effects of load impedance variations in subsequent stages. The build out resistor 114 matches the characteristic impedance of the transmission line 116 so as to block reflected signals. The build out resistor 114 and may be selected based on a difference between the impedance of the buffer 112 and the transmission line 116.

The second input of the first phase detector 104 is, in essence, the output clock signal as detected after the buffer 112 and prior to the resistor 114. The detection of the output clock signal could occur at different locations, for example just after the VCO 110, but it is preferable to detect the signal as close to the start of the transmission line 116 as possible.

The second input of the second phase detector 106 is a representation of the reflection of the clock signal off the destination device 150, e.g. the reflected clock signal. An amplifier 126 compares, for example by subtracting, a signal output by the buffer 112 with the signal (including the output clock signal and the reflected clock signal) as detected after the build out resistor 114. The output of the amplifier 126 is a representation of the signal reflected off the destination device.

In essence the amplifier 126 measures the current polarity and magnitude across the build out resistor. Resistors 120 and 122 reduce the amplitude of the signal output from the buffer 112 to match the attenuation attributable to the resistor 114 and the transmission line impedance. As such the values for the resistors 120 and 122 may be set based on the build out resistor 114 and the transmission line 116. The amplifier 126 along with resistors 120, 122 and 114 form what is generally referred to as a hybrid circuit. A hybrid circuit subtracts the locally generated signal component from that carried on a bidirectional transmission line—effectively extracting the portion of the signal that originated from the other end of the transmission line. Thus, the signal from the amplifier 126 is the clock signal as delayed by traveling the length of the transmission line 116 and being reflected back by the un-terminated destination device 150—generally referred to herein as the delayed clock signal.

Figure 3:
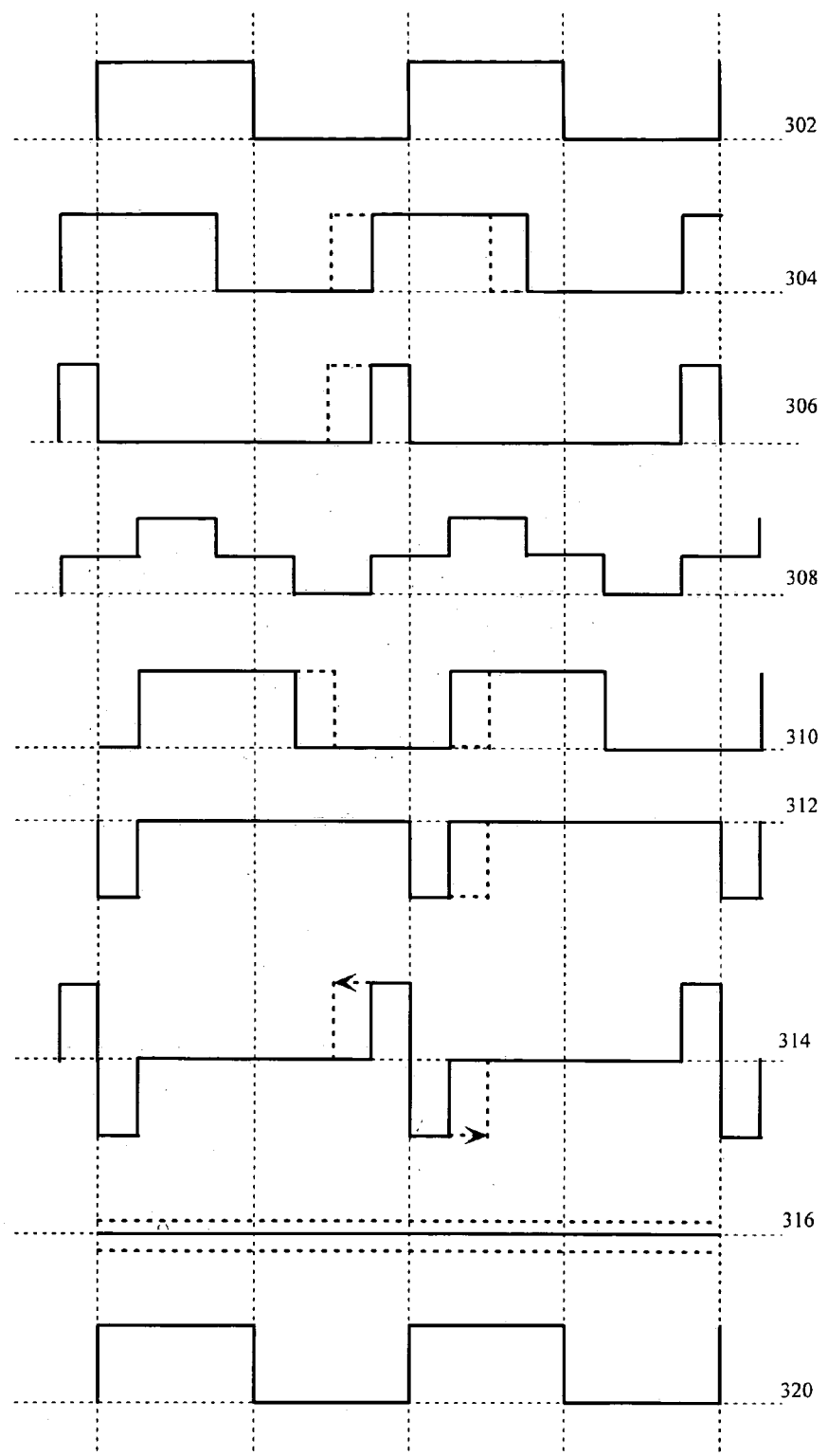
FIG. 3 is a timing diagram useful for explaining the operation of a clock distribution system in accordance with the preferred embodiments of the present invention.

FIG. 3 is a timing diagram useful for explaining the operation of a clock distribution circuit in accordance with the preferred embodiments of the present invention. Reference signal 302 is the clock signal output by clock 102. Signal 304 is a representation of a signal, as seen between the buffer 112 and the build out resistor 114, e.g. the output clock signal. This signal is also supplied as feedback to the first phase detector 104. Signal 306 represents the output of the phase detector 104, e.g. the lead of the output clock signal. Signal 308 is a representation of a signal, after the build out resistor 114. As such the signal 308 is the sum of the output of the build out resistor 114 (from the buffer 112) plus the reflected signal returning from the transmission line 116. Signal 310 is a representation of a signal output by the amplifier 126, supplied as feedback to the second phase detector 106. Signal 312 represent the output of the phase detector 106, e.g. the reflection return lag. Signal 314 represents the unfiltered input signal to the VCO 110. Signal 316 represents the filtered VCO input, e.g. the output of the sum/average circuit 108. Signal 320 is a representation of a signal, as seen by the destination device 150.

In FIG. 3 signals 304 though 314 have alternative traces shown in dotted line indicating the temporary shifts evident during start up or shifts causes by changes in the length or electrical characteristics of the transmission line 116. In response to such changes the voltage supplied to the VCO 110, as represented by signal 316, would temporarily increase or decrease to adjust the phase (and hence the frequency) of the output thereof.

Reference signal 302 is the clock signal that is to be propagated to the various destination devices (of which only a single device 150 is shown). To ensure that the signal received by the destination device 150 coincides with the reference signal 302 with respect to time, some lead must generally be introduced into the output clock signal 304. A representation of such lead can be seen in the signal 306. The amount of lead will vary from device to device based on the length of the transmission line 116 and the effects of any interceding components. In accordance with a preferred embodiment of the present invention, the amount of lead introduced is based on a percentage of the delay, e.g. the lag, sensed in the return signal 310. A representation of the lag detected in the return signal can be seen in the signal 312.

For phase detectors (e.g. 104 and 106) of equal gain, the percentage of the sum from each phase detector will be fifty percent. The goal is for the DC feedback null point to occur when the transmitted phase lead is equal to the received phase lag. The portions of input from each phase detector 104 and 106 are analogous to the propagation times to and from the destination device. Given that the time to travel the length of the transmission line 116, are the same in either direction, the portions of input from either phase detector 104 and 106 are equal in magnitude, and opposite in polarity relative to the DC reference. The feedback null point therefore represents the phase at far end of the transmission line 116, being the mid point of the total round trip, and zero phase offset from the reference. The percentages of feedback from either phase detector 104 or 106 may be varied to compensate for any unbalances present in the two feedback paths. The percentage may vary depending on any unbalances present in the two feedback paths.

The signal 308 is a representation of the transmitted signal and the reflected signal as detected at the start of the transmission line 116. If the signal were sample progressively closer to the destination device 150, the effects of the reflected signal would be incrementally reduced to zero. The amplifier 126 acts as part of a hybrid circuit to filter out the transmission signal leaving the reflected signal, as represented by signal 310. As stated above, this is accomplished by comparing a percentage of the output of the buffer 112 with the signal after the build out buffer 114. The percentage of the signal output of buffer 112 used for the comparison may, for example be 50%, but may also vary depending on the portions of the transmission line impedance represented by buffer 112 and build out resistor 114. To prevent a second signal reflection at the source, the sum of the output impedance of buffer 122 and the build out resistor 114 should match the impedance of the transmission line 116.

Supplying a signal 316, representing the average of the signals 306 and 312, to the VCO 110 provides a basis for an output clock signal 304 that, upon propagating across the transmission line 116, will present an accurate representation of the reference signal at the destination device 150.

Figure 2:
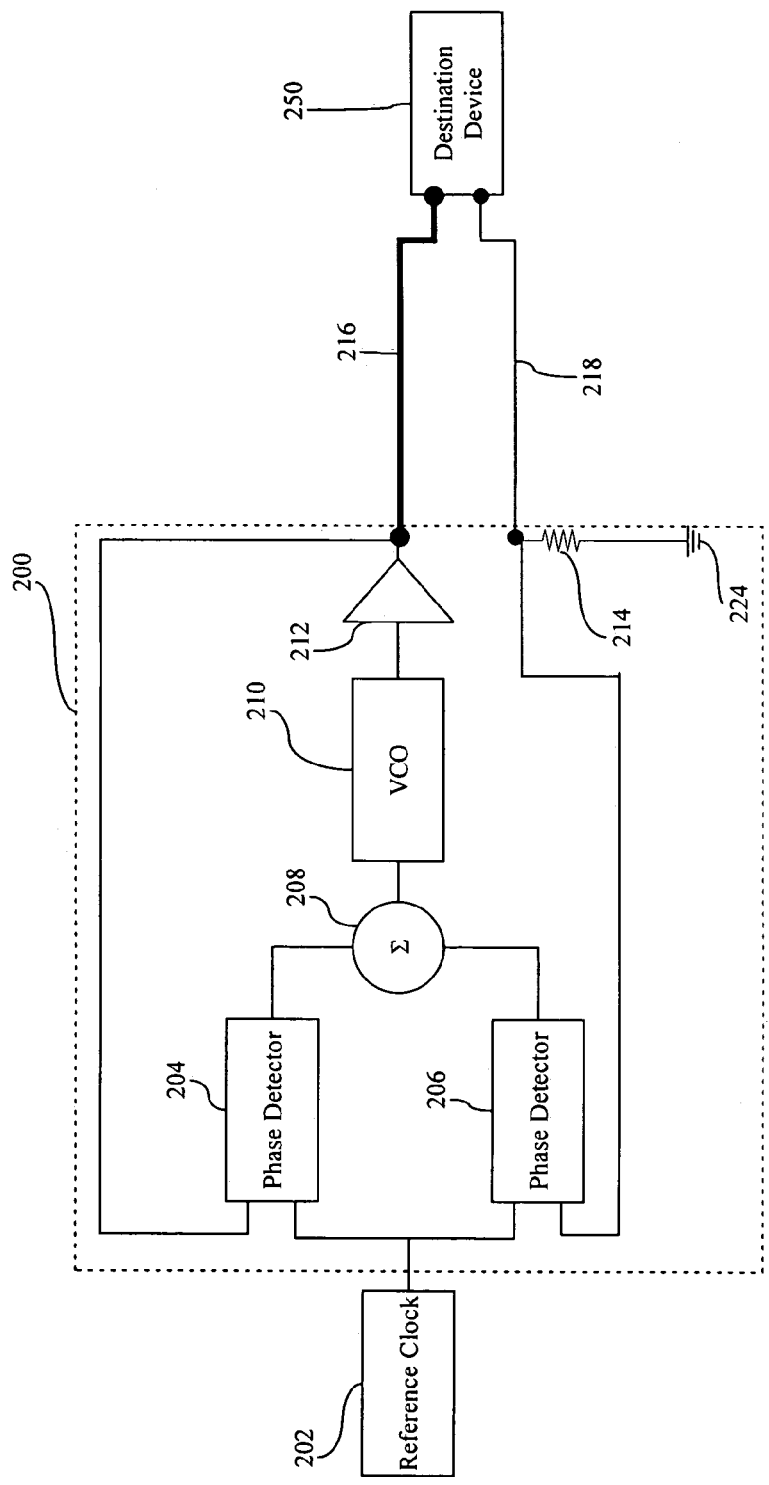
FIG. 2 is a block diagram of a clock distribution circuit in accordance with a second preferred embodiment of the present invention.

FIG. 2 is a block diagram of a clock distribution circuit 200 in accordance with a second preferred embodiment of the present invention. It will be appreciated by those of ordinary skill in the relevant arts that the clock distribution circuit 200, as illustrated in FIG. 2, and the operation thereof as described hereinafter is intended to be generally representative such systems and that any particular system may differ significantly from that shown in FIG. 2, particularly in the details of construction and operation of such system, and still fall within the scope of the invention and the appended claims. As such, the clock distribution circuit 200 is to be regarded as illustrative and exemplary and not limiting as regards the invention described herein or the claims attached hereto. It is also to be noted that the block diagram shown in FIG. 2 has been simplified to avoid obscuring the present invention. Further, there are functional components that have been left out or conveniently combined with other functional components in FIG. 2.

FIG. 2 illustrates an embodiment of the present invention with respect to parallel termination. A reference clock 202 is supplied to a first input of a first phase detector 204 and a first input of a second phase detector 206. In general, the first phase detector 204 detects a phase lead of the output clock signal, while the second phase detector 206 detects a phase lag of a returned clock signal. The clock distribution circuit 200 outputs a signal based on the average of the phase lead and the phase lag.

The example shown in FIG. 2 illustrates a single clock signal sent to a single destination device. Those of ordinary skill in the art will recognize that most implementations of the clock transmission system will involve multiple instances of the clock transmission circuit 200 with multiple transmission and signal return line 216 and 218. Each transmission line and signal return line would have an instance of a clock distribution circuit 200 all fed by the same reference clock. Each instance would preferably be connected to the reference clock 202 with a trace of the same length and electrical characteristics. It is possible for the output of any single clock distribution circuit 200 to feed multiple instances of other clock distribution circuits much in the same configuration as a distributed clock networks.

In accordance with the second embodiment of the present invention, the clock distribution circuit 200 uses a signal return line 218 matched to the transmission line 216 to provide, at the source, the returned clock signal. As with the first preferred embodiment, the round trip transmission delay time is compared against the output of the clock buffer, e.g. buffer 212, to determine the mid-point of the return signal delay. As the returned clock signal is segregated from the output clock signal, additional circuitry is eliminated at the price of having to geometrically match the signal return line 218 to the transmission line 216.

A summing circuit 208 averages the outputs of the phase detector 204 and the phase detector 206. The output of the summing circuit 208 is used to drive a voltage-controlled oscillator (VCO) 210. The resultant clock signal is supplied to a transmission line 216 via a buffer 212. The buffer 12 acts to isolate the VCO 210 from the effects of load impedance variations in subsequent stages. The second input of the first phase detector 204 is taken after the buffer 212 at the start of the transmission line 216. The second input of the second phase detector 106 is connected to the signal return line 218. A resistor 214, shunted to ground 224, terminates the signal return line 218 and, as such, should be selected to match the characteristic impedance of the signal return line 218 so as to eliminate or reduce reflected signals.

The representative signals shown in FIG. 3 may also be used to illustrate the function of the clock distribution circuit 200. Reference signal 302 is the clock signal output by clock 202. Signal 304 is a representation of a signal supplied as feedback to the first phase detector 204. Signal 310 is a representation of a signal supplied as feedback to the second phase detector 206. Signal 320, is a representation of a signal as received by the destination device 250. As the returned signal is obtained from a separate signal return line 218, the signal 308 is not applicable. As in the first embodiment, taking the average of the signals 306 and 312 provides a basis for an output signal that, upon propagating across the transmission line 216, will present an accurate representation of the reference signal at the destination device 250.

Although two embodiments of the present invention has been shown and described, it will be appreciated by those skilled in the art that changes may be made in these embodiments without departing from the principles and spirit of the invention, the scope of which is defined in the claims and their equivalents.

What is claimed is:

1. A method of distributing a clock signal over a transmission line, the method comprising:
   providing a return line geometrically matched to the transmission line;
   generating an output clock signal onto a transmission line;
   detecting a returned clock signal on the return line;
   detecting a first phase difference between a reference clock signal and the output clock signal;
   detecting a second phase difference between the reference clock signal and the returned clock signal;
   controlling the phase of the output clock signal based on an average of the first and second phase differences.

2. A method of distributing a clock signal, the method comprising:
   generating an output clock signal onto a transmission line;
   detecting a returned clock signal by sensing a reflection of the output clock signal on the transmission line;
   detecting a first phase difference between a reference clock signal and the output clock signal;
   detecting a second phase difference between the reference clock signal and the returned clock signal;
   controlling the phase of the output clock signal based on an average of the first and second phase differences.

3. A method, as set forth in claim 2, wherein the reflected signal is sensed by comparing the output clock signal with a composite signal from the transmission line, the composite signal including the output clock signal and a reflection of the output clock signal from the destination.

4. A method, as set forth in claim 1, wherein the step of controlling the phase of the output clock signal comprises driving a voltage controlled oscillator using the average of the first and second phase differences.

5. A method, as set forth in claim 4, further comprising buffering the output of the voltage controlled oscillator.

6. A method of distributing a clock signal, the method comprising:
   generating an output clock signal onto a transmission line;
   detecting a returned clock signal;
   detecting a first phase difference between a reference clock signal and the output clock signal;
   detecting a second phase difference between the reference clock signal and the returned clock signal;
   controlling the phase of the output clock signal based on an average of the first and second phase differences by driving a voltage controlled oscillator using the average of the first and second phase differences; and
   buffering the output of the voltage controlled oscillator and providing a build out impedance to match the transmission line impedance.

7. A clock distribution circuit comprising:
a first phase detector that outputs a phase lead of an output clock signal;
a second phase detector that outputs a phase lag of a returned clock signal;
circuitry that propagates the output clock signal onto a transmission line based on the average the output of the first phase detector and the second phase detector; and
circuitry to detect the returned clock signal as a reflected clock signal on the transmission line.

8. A clock distribution circuit comprising:
a first phase detector that outputs a phase lead of an output clock signal;
a second phase detector that outputs a phase lag of a returned clock signal;
circuitry that propagates the output clock signal onto a transmission line based on the average the output of the first phase detector and the second phase detector; and
a signal return line separate from the transmission line, wherein the returned clock signal is sensed from the signal return line.

9. The clock distribution circuit, as set forth in claim 8, wherein the signal return line is matched to the transmission line.

10. A clock distribution system comprising:
a referent ce clock that output a clock signal;
a first clock distribution circuit comprising;
a first phase detector that outputs a phase lead of a first output clock signal;
a second phase detector that outputs a phase lag of a first returned clock signal; and
first circuitry that propagates the first output clock signal onto a first transmission line based on the average the output of the first phase detector and the second phase detector;

a second clock distribution circuit comprising:
a third phase detector that outputs a phase lead of a second output clock signal;
a fourth phase detector that outputs a phase lag of a second returned clock signal; and
second circuitry that propagates the first output clock signal onto a second transmission line based on the average the output of the third phase detector and the fourth phase detector; and
wherein the first transmission line is a different length than the second transmission line and the first and second output clock signals coincide at the end of the first and second transmission line.

11. A method of distributing a reference clock signal, the method comprising:
sensing an output clock signal to be sent over a transmission line;
sensing a reflected clock signal at the beginning of the transmission line; and
adjusting the output clock signal based on an average of a first phase difference between the output clock signal and the reference clock signal and a second phase difference between the reflected clock signal and the reference clock signal.

12. A method of distributing a reference clock signal, the method comprising:
sensing an output clock signal to be sent over a transmission line;
sensing a returned clock signal at the end of a signal return line matched to the transmission line; and
adjusting the output clock signal based on an average of a first phase difference between the output clock signal and the reference clock signal and a second phase difference between the returned clock signal and the reference clock signal.

* * * * *